United States Patent [19]

de Jonge

[11] 4,151,600
[45] Apr. 24, 1979

[54] MAGNETO-RESISTIVE DETECTOR WITH SCANNING BUBBLE DOMAIN

[75] Inventor: Frederik A. de Jonge, Eindhoven, Netherlands

[73] Assignee: U.S. Philips Corporation, New York, N.Y.

[21] Appl. No.: 727,048

[22] Filed: Sep. 27, 1976

[30] Foreign Application Priority Data

Sep. 30, 1975 [NL] Netherlands ............... 7511483

[51] Int. Cl.² ............................................. G11C 19/08
[52] U.S. Cl. ............................................. 365/8; 365/2; 365/15; 365/33
[58] Field of Search ................ 340/174 EB, 174 TF; 365/2, 8, 7

[56] References Cited

U.S. PATENT DOCUMENTS

| 3,691,540 | 9/1972 | Almasi et al. | 340/174 EB |
| 3,701,128 | 10/1972 | Copeland | 365/8 |
| 3,716,781 | 2/1973 | Almasi et al. | 340/174 EB |
| 3,793,639 | 2/1974 | de Jonge | 340/174 TF |
| 3,813,660 | 5/1974 | Buhrer | 365/8 |
| 4,094,003 | 6/1978 | Kinsner et al. | 365/7 |

OTHER PUBLICATIONS

IBM Technical Disclosure Bulletin, vol. 14, No. 7, Dec. 1971, pp. 2121–2122.

Primary Examiner—James W. Moffitt
Attorney, Agent, or Firm—Thomas A. Briody

[57] ABSTRACT

A device for reading information-representing magnetization patterns by means of a magneto-resistive element. The magneto-resistive element is in magnetic flux coupling with a plurality of magnetization patterns simultaneously. A desired portion of the element is selected for reading by influencing such portion by the external magnetic field of a magnetic bubble domain. Information positions can be read in sequence by moving the bubble domain along magneto-resistive element.

6 Claims, 12 Drawing Figures

MAGNETO-RESISTIVE DETECTOR WITH SCANNING BUBBLE DOMAIN

The invention relates to a device for reading information-representing magnetization patterns comprising an elongate magneto-resistive element which is connected to means for providing a measuring current and to a detection circuit.

A reading device of the above-described type is known from the U.S. Pat. No. 3,493,694.

The above noted U.S. patent describes a device in which a magneto-resistive element in the form of a strip of ferromagnetic, metallic, magnetically anisotropic material, for example, Ni-Fe, which is traversed by a measuring current in its longitudinal direction, is contacted with one of its edges with a magnetic tape to be read. The field associated with the magnetization pattern of the magnetic tape produces variations in the magnetization direction of the element which without a field is parallel to the longitudinal direction thereof, which results in a resistance variation of the element, the so-called magneto-resistance effect. As a result of this the output signal of a detection circuit connected to the element assumes the form of current or voltage fluctuations which are indicative of the information read.

The above noted U.S. patent mentions in particular the use of magneto-resistive elements in video recorders. For that purpose, a number of magneto-resistive elements are provided in slots at the circumference of a so-called head disk which is rotating at a high speed and scans a recording medium which is conveyed past it transversely to the longitudinal direction. However, it is desirable to replace such rotating scanning devices by stationary ones. This might be realised by means of a scanning device which comprises, in each of the information positions of a track extending transversely over the recording medium, a magneto-resistive element, or more generally, a magnetic field-sensitive element.

In this connection, U.S. Pat. No. 3,443,036 discloses a device which comprises in each of the information positions a strip of Hall effect material, such "Hall elements" each comprising a couple of current supplying means and a couple of voltage deriving means, a shift register being present to handle the signals of the Hall elements in sequence. A drawback of this device is that a large number of individual "Hall elements" and associated leads are required, as well as a complicated shift register circuit.

A reading device of the type described in the opening paragraph of this specification is furthermore known from German Auslegeschrift No. 2,148,081.

The above noted German specification describes a device in which for the detection of the presence or absence of a magnetic bubble domain, by which a 1 or a 0, respectively, is represented, in a given position in a thin magnetizable layer, an elongate magneto-resistive element is provided on a layer adjacent to the noted position. Such detectors are used in certain bubble domain memory systems. When such a memory system has a "major-minor loop", organization, in which the detector is present near the "major loop", it takes a relatively long time to read the individual "minor loops". In order to perform this more rapidly, all the "minor loops" should have their own detectors with associated leads and control circuits. This makes such a system complicated.

It is the object of the invention to provide a reading device of the kind mentioned in the opening paragraph which does not exhibit the above-mentioned drawbacks of the known devices and which is suitable both for magnetic tape reading applications and for magnetic bubble domain detection.

According to the invention this object is achieved in that the reading device comprises in addition a plate of magnetizable material having uniaxial anisotropy which is provided with a transport track for magnetic bubble domains parallel to the longitudinal axis of the magneto-resistive element and with driving means for displacing a magnetic bubble domain which can be generated by a generator and has a cross-section which is smaller than half the length of the magneto-resistive element along the transport track. The magneto-resistive element is disposed near the transport track so that the magnetic field of the bubble domain and the magnetic field associated with the magnetization pattern to be read causes, at the instantaneous position of the bubble domain along the track, a change in the magnetization state of the portion of the magneto-resistive element located near the bubble domain. Such change differs in a detectable manner from the change produced in the remainder of the magneto-resistive element by the field associated with the magnetization pattern alone.

The operation of the device according to the invention is based on the fact that by influencing a magnetic bubble domain which can be moved along a magneto-resistive element a distinct part of the element can be selected for reading, so that, as will be explained hereinafter, the plurality of magneto-resistive elements which would otherwise be necessary for selective reading can be replaced by a single elongate element, and shift register circuits and control circuits, respectively, become superfluous.

According to a first preferred feature of the invention the device is directed to the reading of a magnetic field which varies in time and is associated with an information-representing magnetization pattern and is characterized in that the field of the bubble domain biases the magneto-resistive element at the instantaneous position of the bubble domain along the track to a point away from the maximum resistance on its resistance-external field characteristic.

This preferred feature is based on the fact that the resistance-external field characteristic of magneto-resistive elements shows an approximately quadratic variation. This means that if a field to be detected varies with at a frequency $\omega$, the voltage across the element varies by a frequency $2\omega$. However, with the field of a bubble domain part of the magneto-resistive element can be adjusted so that across said part of the element the voltage varies by a frequency $\omega$. By separating the $\omega$ component of the output signal from the $2\omega$ component, only that part of the magneto-resistive element is selected for reading which is influenced by the field of a bubble domain. By moving the bubble domain continuously along the magneto-resistive element, the device then operates as a scanning reading device.

According to a second preferred feature of according to the invention the device is directed to the reading of information represented by the presence or absence of a magnetic bubble domain and is characterized in that the magneto-resistive element extends along a plurality of further bubble domain positions and is arranged so that the field of a further bubble domain to be read and the field of a said bubble domain generated in the magnetization plate oppose each other at the location of the magneto-resistive element.

This preferred feature is also based on the specific variation of the resistance-external field characteristic of magneto-resistive elements. This is characterized by maximum resistance with an external field zero. In the further bubble domain positions along which the magneto-resistive element extends further bubble domains may occur or may not occur at a given instant. This results in a given resistance of the element. When a position having a further bubble domain is selected for reading by adding a bubble domain the stray field of which opposes the field of the further bubble domain to be read, the resistance is increased locally and hence the resistance of the overall element. When a position without a further bubble domain is selected for reading, the stray field of the added selection bubble domain just ensures a local decrease of the resistance and hence a decrease of the resistance of the overall element. By moving the added selection bubble domain rapidly along the magneto-resistive element a number of further bubble domain positions which for example may form part of a corresponding number of bubble domain memory loops can rapidly be read sequentially in this manner.

Embodiments of the invention will be described in greater detail, by way of example, with reference to the accompanying drawings, in which.

Figure 1:
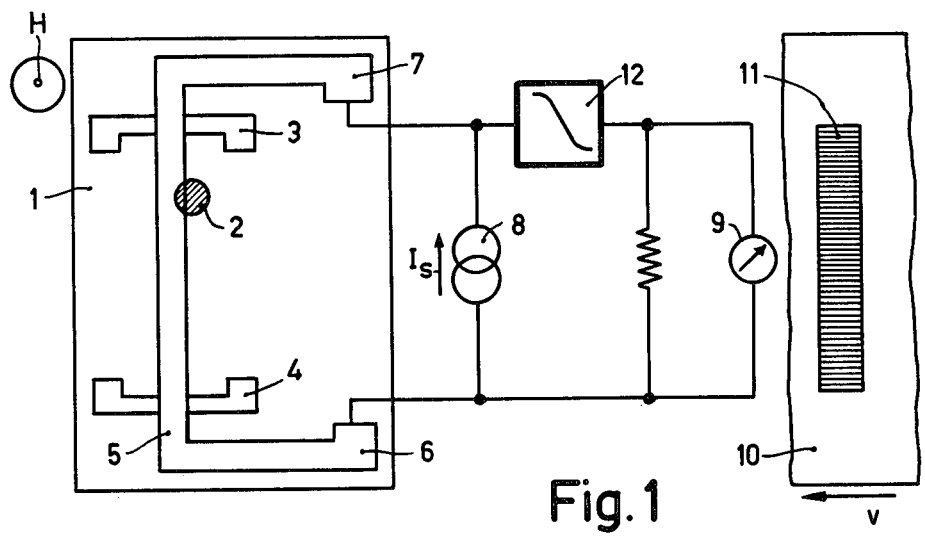
FIG. 1 shows partly diagrammatically and partly as a plan view a device for reading a magnetic medium in which an elongate magneto-resistive element is provided on a thin plate in which a bubble domain is moved.

Referring now to FIG. 1, a reading device is shown which includes a thin plate of magnetizable material having uniaxial anisotropy in which stable cylindrical domains, so-called magnetic bubble domains, can exist and are moved by means of field gradients.

By "plate" in this specification is meant a slice of material which is self-supporting or a layer of material on a substrate. The plate 1 consists, for example, of a material such as orthoferrite or garnet. In the embodiment shown it has the composition $Y_{2.7}Sm_{0.3}Fe_{3.8}Ga_{0.2}O_{12}$ ($4\pi M_s = 155$ Gauss) and a thickness of 5 microns and is biased by a magnetic field H having a field strength of approximately 45 Oersted which is normal to the plane of the plate. This bias field ensures the stabilization of a bubble domain 2. The bubble domain 2 is generated by means of any of a plurality of known devices which need not be further described. The bubble domain 2 in the plate 1 is moved along a magneto-resistive element 5 provided on top of the plate 1 under the influence of a magnetic gradient field generated by current conductors 3 and 4.

The dimensions and location of the conductors 3 and 4 define a transport track for the magnetic bubble domain 2 parallel to the longitudinal axis of the element 5, and means to provide current to the conductors 3 and 4 (not shown) constitute driving means to move the domain 2 along that transport track. A suitable material for element 5 is, for example, a nickel-iron alloy. The element 5 is connected to a current source 8 via terminals 6 and 7. In the example shown the source 8 supplies a constant measuring current $I_s$. For reading information, the element 5 is brought into a magnetic flux coupling relationship with a recording medium 10 comprising magnetization patterns arranged in information tracks 11. In the example shown the medium 10 is a magnetic tape which is moved parallel to the plane of the plate 1 in the direction of the arrow v. The magnetic field associated with the magnetization patterns causes a rotation of the direction of magnetization of the element 5. As a result of this the resistance of the element 5 varies and hence the voltage across it.

Figure 2:
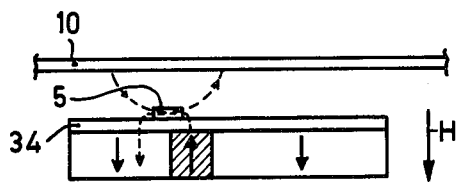
FIG. 2 is a cross-sectional view of the thin plate of FIG. 1 which is flux-coupled to a magnetic medium.
Figure 3A:
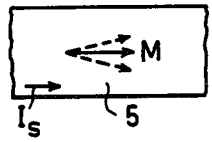
FIG. 3a shows diagrammatically the condition of a part of the magneto-resistive element of FIG. 1 when no bubble domain is present near that part.
Figure 3B:
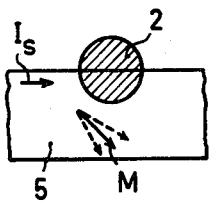
FIG. 3b shows diagrammatically the condition of a part of the magneto-resistive element of FIG. 1 when a bubble domain is present near that part.

FIG. 2 which is a cross-sectional view of the plate 1 at the area of the bubble domain 2 and in which, as in FIGS. 3a and 3b, the same reference numerals are used for the same components as in FIG. 1, shows how the field of the medium 10 influences the magneto-resistive element 5. A non-magnetic spacer layer is referenced 34.

Figure 4A:
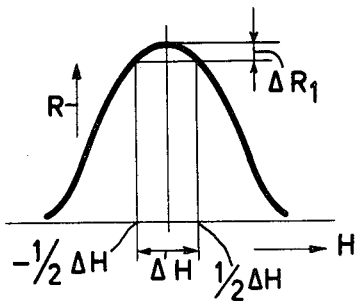
FIG. 4a shows in a curve how the resistance of a magneto-resistive element varies as a function of an external magnetic field.
Figure 4B:
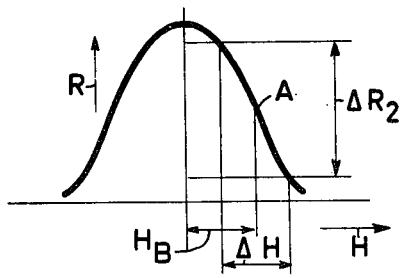
FIG. 4b shows in a curve how the resistance of a megneto-resistive element varies as a function of an external magnetic field when the element is "biased" by a magnetic bubble domain.
Figure 4C:
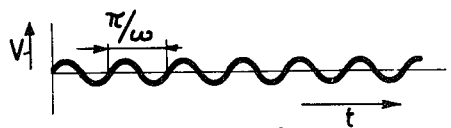
FIG. 4c shows the output signal of a non-biased magneto-resistive element as a function of time.

FIG. 3a shows how a magnetic field varying in time rotates the direction of magnetisation M (solid line arrow) of the part of the element 5 shown over certain angles (broken line arrows) when a bubble domain is present near that part of the element 5. In FIG. 4a the resistance variations $\Delta R_1$ is shown which is produced by a magnetic field variation $\Delta H/2$ in these circumstances, and FIG. 4c shows how the voltage V across the element 5 correspondingly varies. From FIG. 4a it follows that, when a magnetic field varies in time between the values $+\frac{1}{2}\Delta H$ and $-\frac{1}{2}\Delta H$ with a frequency $\omega$, the voltage across the element 5 will vary with a frequency $2\omega$.

Figure 4D:
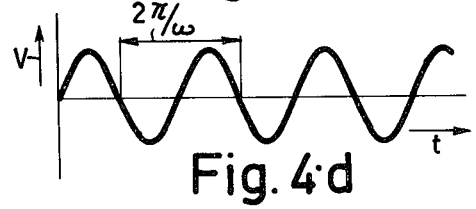
FIG. 4d shows the output signal of a magneto-resistive element biased by a bubble domain as a function of time.

This situation changes when the bubble domain 2 is present near that part of the element 5. In the example shown the element 5 has a thickness of 0.05 micron and a width of 5 micron and the bubble domain 2 has a diameter of 8 microns. For a good influencing of the element 5 by the stray field of the bubble domain 2, the center of the bubble domain 2 is present slightly beyond the edge of the element 5. FIG. 2 shows how the stray field of the bubble domain 2 which in this example has a field strength of approximately 50 Oersted, influences the element 5. FIG. 3b shows how under the influence of the bubble domain 2 the direction of magnetization M of the nearby part of the element 5 (solid-line arrow) is rotated through an angle of approximately 45° with respect to the situation shown in FIG. 3a. A variation of the field of the magnetic tape 10 will vary the direction of magnetization M between the positions shown in FIG. 3b by broken-line arrows. As shown in FIG. 4b, this means that the element 5 is adjusted to the point A of its resistance-external field characteristic by the stray field $H_B$ of the bubble domain and that a magnetic field varying by amplitude $\Delta H$ now causes the resistance variation $\Delta R_2$. The resulting variation of the voltage is shown in FIG. 4d. From FIG. 4b it follows that by the adjustment to point A which is caused by the stray field of the bubble domain, a magnetic field varying at a frequency $\omega$ at the area of the bubble domain will produce a contribution to the voltage across element 5 varying at a frequency $\omega$. By conveying the signal of the element 5 through a lowpass filter 12 which passes the signal component of frequency $\omega$ but cuts off the signal component of frequency $2\omega$ (the contributions of the parts of the element 5 where the bubble domain 2 is not present), only the magnetization pattern of that one of the tracks 11 is read via the measuring instrument 9 which is present below a part of the element selected by the bubble domain 2. By moving the bubble domain 2 along its transport track from conductor 3 to conductor 4, the information of the tracks 11 can be read sequentially.

It will be apparent that the bubble domain 2 must have a cross-section which is smaller than half the length of the element 5 along the transport track between the conductors 3 and 4 so that two or more information tracks 11 can be read sequentially.

It is to be noted, by comparing FIGS. 4a and 4b, that the magnitude of the resistance variation which is produced by a field variation $\Delta H$ considerably depends on whether or not the magneto-resistive element 5 is "biased". Associated with the adjustment to point A (by the stray field of bubble domain 2) is a resistance variation $\Delta R_2$ which is many times larger (for example 20 times larger) than the resistance variation $\Delta R_1$ of the non-"biased" element. This means that the signal of an information position selected by the bubble domain 2 (the signal of frequency $\omega$) is many times larger than the signal of each of the non-selected information positions (the signal of frequency $2\omega$). Also due to this condition, the signals of frequency $\omega$ and $2\omega$ can easily be separated from each other.

Figure 5:
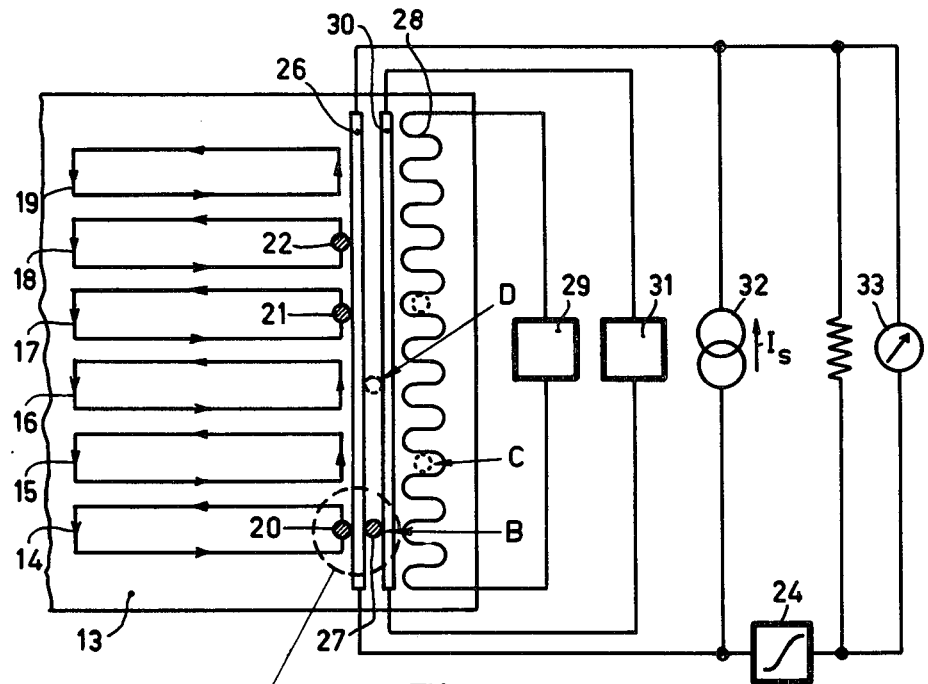
FIG. 5 shows a part of a memory system having a number of memory loops along which bubble domains are moved and a reading device comprising a magneto-resistive element along which a selection bubble domain is moved.

The reading device shown in FIG. 5 is based on the same technological idea as the device shown in FIG. 1. Therefore, reference should be made to the latter for the relevant details. FIG. 5 shows a thin plate 13 of magnetizable material in which stable magnetic domains, so-called magnetic bubble domains, can exist and be moved. A number of memory loops ("minor loops") 14 . . . 19 are provided on the plate 1 and form part of a bubble domain memory system not further shown. Information-representing bubble domains (the bubble domains 20, 21, 22 of which are shown) are moved along said loops 14 . . . 19. This is done in a known manner (which need not be described in detail) by means of a rotary magnetic field in the plane of the plate 13 and a soft magnetic propagation structure. A magneto-resistive element 26 extends along the loops 14 . . . 19. This is connected to a current source 32 and a measuring instrument 33. A bubble domain 27 which is generated in known manner (not to be described) is moved along a propagation structure 28 by means of a driving device 29. It is situated on the right-hand side of a current wire 30 which can be energized at desired instants by means of a device 31. At said instants, a current pulse through the wire 30 ensures that the bubble domain 27 jumps to the left-hand side of the wire 30.

Figure 6:
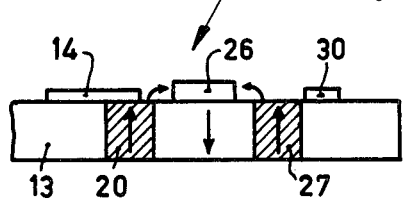
FIG. 6 is a cross-sectional view of a detail of the device in FIG. 5.
Figure 7A:
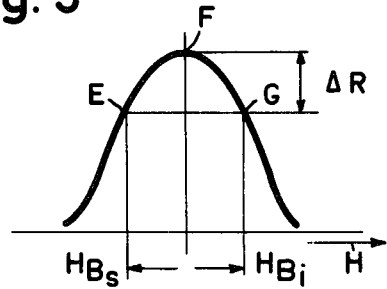
FIG. 7a shows in a curve the resistance of a magneto-resistive element as a function of the magnetic field by which it is influenced, in which the effect is shown of an information bubble domain and of a selection bubble domain.

The propagation structure 28 and the current wire 30 thus define a transport track for the bubble domain 27, and the devices 29 and 31 constitute driving means to move the bubble domain 27 along the transport track. The situation denoted by B shows the bubble domain 27 on the left-hand side of the wire 30. This situation is shown on an enlarged scale in FIG. 6 which is a sectional view of a detail of the device shown in FIG. 5. In this situation, a bubble domain 20 is present in the loop 14 in a position which is opposite to bubble domain 27 with respect to the element 26. FIG. 6 shows that in that case the stray fields of bubble domains 20 and 27 at the location of element 26 are directed oppositely. FIG. 7a shows the consequence which this has locally for the resistance of element 26. The stray field $H_{Bi}$ of information bubble domain 20 alone would involve an adjustment to point E of the resistance-external field characteristic, the stray field $H_{Bs}$ of selection bubble domain 27 alone would cause an adjustment to point G: When these fields are present simultaneously, an adjustment to point F of the characteristic results. From FIG. 7a it follows that if bubble domain 27 is moved along the propagation structure 28 from the bottom to the top and is forced to jump for a short period of time to the left-hand side of the wire 30 in the places where the loops 14 . . . 19 are present, the resistance of element 26 increases if a bubble domain is present in a selected loop in a place adjoining element 26 (for example situation B) and decreases if no bubble domain is present in a selected loop in a place adjoining element 26 (for example situation D).

Figure 7B:
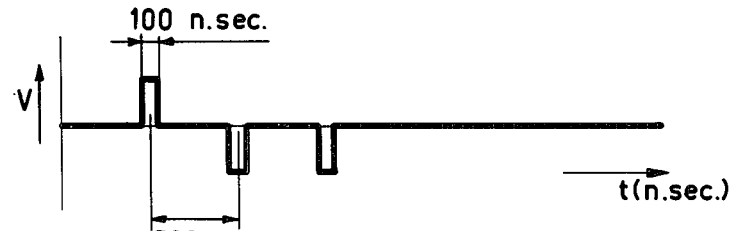
FIG. 7b shows the output signal of the reading device of FIG. 5 as a function of time.

In the situation denoted by C, the position of the bubble domain 27 is denoted by a broken-line circle. This position is on the right-hand side of the wire 30. In that case, the bubble domain has not yet jumped to the left or it has already jumped back again. If successively three memory loops are selected which contain a bubble domain, do not contain a bubble domain, and do not contain a bubble domain, respectively, in a place adjoining element 26, the voltage measured by measuring instrument 33 varies in the manner as is shown in FIG. 7b. From this it may be seen that the selection of the loops takes place with spaces of 500 nanosec.

It is to be noted that the bubble domains 20, 21, 22 and so on are moved along the loops 14 . . . 19 at a speed which is considerably smaller than the speed at which bubble domain 27 is moved along element 26. For example, the loops 14 . . . 19 each comprise twenty bubble domain positions (which may or may not be occupied) and the bubble domains are moved from position to position under the influence of rotary field having a frequency of 100 kHz, and bubble domain 27 moves the transport track between loop 14 and loop 19 within ten microsec. The instants at which the bubble domain 27 is forced to jump over are synchronous with the rotary field. For example, the propagation structure 28 is operated at a frequency of 109 Hz and the rotary field for the loops 14 . . . 19 is controlled via the frequency divider.

The bubble domains moving along the memory loops cause a comparatively slow variation of the voltage across element 26. The voltage variations which are the result of the selection of loops by bubble domain 27 and the reading of the information present therein are much faster. The device is now provided with a high-pass filter 24 which ensures that low frequency voltage variations which are the result of the movement of the bubble domains along the loops do not occur in the output signal. For this purpose it is necessary, for example, that all signals having a frequency below 1 MHz should be suppressed.

What is claimed is:

1. A magnetoresistive sensing device for selectively reading information-representing magnetization patterns at a plurality of separate information positions, comprising:

a single elongate magneto-resistive sensing element disposed in said magnetization patterns adjacent said information positions;

a plate of magnetizable material having uniaxial anisotropy and including a magnetic bubble domain transport track, which track is disposed substantially parallel to said sensing element;

means which move a first magnetic bubble domain along said track to scan a plurality of successive locations, each of said locations being disposed adjacent a discrete area of said sensing element which is coupled to the magnetic field at one of said information positions, the relative size of said first magnetic bubble domain and the disposition of said locations being such that the magnetic field associated with said first bubble domain influences the resistance of only a corresponding one of said discrete areas from each of said locations; and means connected to said sensing element which function to detect resistance variations in said sensing element and which distinguish between resistance variations produced in the discrete area which is influenced by the field of said first bubble domain and resistance variations produced in the remainder of said sensing element.

2. A sensing device as claimed in claim 1 wherein the information positions are positions on a magnetic storage medium and wherein the magnetic field of said first bubble domain biases the influenced discrete area to a point in the substantially linear portion of its electrical resistance/magnetic field characteristic.

3. A sensing device as claimed in claim 1 wherein said information positions are further magnetic bubble domain positions included in said plate and wherein the magnetic fields associated with magnetic bubble domains located at said further positions and the magnetic field associated with said first bubble domain oppose each other at the corresponding discrete areas of said element.

4. A sensing device as claimed in claim 1, wherein said means which detect resistance variations comprises filtering means which cut off signals of a predetermined frequency.

5. A sensing device as claimed in claim 4, wherein said filtering means comprises a lowpass filter.

6. A sensing device as claimed in claim 4, wherein said filtering means comprises a highpass filter.

* * * * *